United States Patent
de Rooij et al.

(10) Patent No.: US 7,652,476 B2
(45) Date of Patent: *Jan. 26, 2010

(54) INTEGRATED CAPACITOR SHIELD FOR BALUN IN MRI RECEIVERS

(75) Inventors: Michael A. de Rooij, Schenectady, NY (US); Eladio Clemente Delgado, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 434 days.

This patent is subject to a terminal disclaimer.

(21) Appl. No.: 11/609,282

(22) Filed: Dec. 11, 2006

(65) Prior Publication Data

US 2008/0136415 A1    Jun. 12, 2008

(51) Int. Cl.
*G01V 3/00* (2006.01)
*G01R 33/36* (2006.01)
*H03H 7/42* (2006.01)

(52) U.S. Cl. .................. 324/322; 324/318; 333/25; 29/825

(58) Field of Classification Search ......... 324/300–322; 600/407–435; 333/25, 219–235; 29/825
See application file for complete search history.

(56) References Cited

U.S. PATENT DOCUMENTS

| 6,956,188 | B2 | 10/2005 | de Rooij et al. | |
| 7,378,851 | B1* | 5/2008 | de Rooij et al. | 324/322 |
| 2007/0106332 | A1* | 5/2007 | Denker et al. | 607/2 |
| 2008/0033497 | A1* | 2/2008 | Bulkes et al. | 607/9 |
| 2008/0051854 | A1* | 2/2008 | Bulkes et al. | 607/60 |
| 2008/0136414 | A1* | 6/2008 | de Rooij et al. | 324/322 |
| 2008/0136415 | A1* | 6/2008 | de Rooij et al. | 324/322 |

* cited by examiner

*Primary Examiner*—Brij B. Shrivastav
*Assistant Examiner*—Tiffany A Fetzner
(74) *Attorney, Agent, or Firm*—Patrick K. Patnode (57) ABSTRACT

A balun is included in a magnetic resonance imaging system. The balun conditions electromagnetic signals received from at least one RF receiver coil. The balun includes a balun shield having an integrated capacitor therein. The balun blocks unwanted feedback from effecting performance of any components contained within the balun shield.

27 Claims, 8 Drawing Sheets

INTEGRATED CAPACITOR SHIELD FOR BALUN IN MRI RECEIVERS

BACKGROUND OF THE INVENTION

The present invention relates generally to a balun in a magnetic resonance imaging (MRI) system, and, more specifically, to a balun shield that includes an integrated capacitor therein.

MRI uses radio frequency pulses and magnetic field gradients applied to a subject in a strong homogenous magnetic field to produce viewable images. When a substance such as human tissue is subjected to a uniform magnetic field (polarizing field $B_0$), the individual magnetic moments of the spins in the tissue attempt to align with this polarizing field, but precess about it, in random order, at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

MR receiver coils receive the emitted electromagnetic signals emanating from the patient and use the acquired signals for image reconstruction. Before image reconstruction occurs, the electromagnetic signals received by the receiver coil elements are conditioned by a balun. The balun helps to improve performance of the receiver coils by providing a high impedance path for common-mode currents in the electromagnetic signal and a low impedance path for differential currents therein. Typically, the balun includes a non-magnetic co-axial conductor wound into a single layer cylindrical coil. The cylindrical coil is then enclosed in a conductive shield and the shield is connected to an output of the conductor by way of a capacitor unit. The capacitor unit, together with the coil, creates a parallel resonant circuit that can be tuned to the imaging frequency to significantly reduce common mode currents propogating down the co-axial conductor.

With this typical design, however, problems can arise with the performance of the balun shield. The balun shield's ability to properly shield the balun (and any other electrical components contained within the balun shield) can be degraded if gaps are present in the balun shield. That is, the connection between the capacitor unit and the coil conductor often requires that a small gap exist in the balun shield to allow for connection of the capacitor unit. As stated above, such a gap can cause instability in components within the balun shield by allowing unwanted feedback of the signal into the interior of the balun.

Therefore, a balun shield design that reduces or eliminates such gaps is greatly desired to improve overall performance.

BRIEF DESCRIPTION OF THE INVENTION

The present invention is directed to an apparatus and method for integrating a capacitor into a balun shield in a magnetic resonance imaging (MRI) system to overcome the aforementioned drawbacks. An end cover in a balun shield is constructed to include an integrated parallel plate capacitor therein.

Therefore, in accordance with one aspect of the present invention, a magnetic resonance imaging (MRI) system includes at least one magnet for generating a magnetic field, at least one gradient coil for manipulating the magnetic field generated by the at least one magnet by way of a gradient field, and at least one receiver coil to receive electromagnetic signals from the manipulated magnetic field. Also included in the MRI system is at least one balun connected to the receiver coil to condition the received electromagnetic signals, the at least one balun including a balun shield having a capacitance and a common-mode inductance to create a parallel resonant circuit.

In accordance with another aspect of the present invention, a balun module includes a common-mode inductor and a shield having an end plate thereon. The balun module further includes a two conductor parallel plate capacitor integrated into the end plate.

In accordance with yet another aspect of the present invention, a method of manufacturing a balun module includes enclosing a common-mode inductor within a balun shield and attaching an end plate to the balun shield. The method further includes integrating a parallel plate capacitor into the balun shield, wherein the parallel plate capacitor has a non-magnetic inner conductor and outer conductor on a dielectric substrate.

Various other features and advantages of the present invention will be made apparent from the following detailed description and the drawings.

BRIEF DESCRIPTION OF THE DRAWINGS

The drawings illustrate one embodiment presently contemplated for carrying out the invention.

In the drawings.

DETAILED DESCRIPTION OF THE INVENTION

Figure 1:
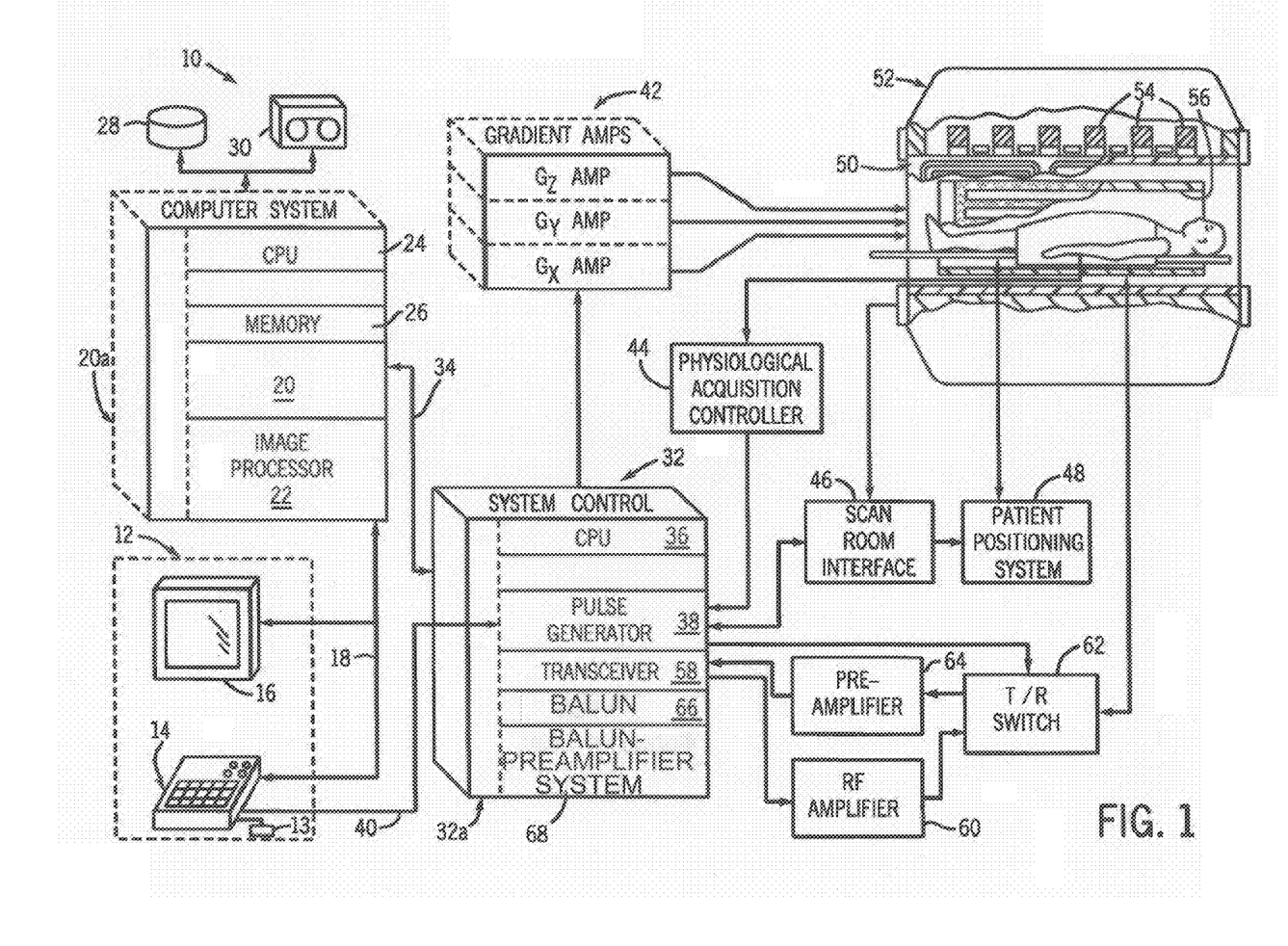
FIG. 1 is a schematic of a magnetic resonance imaging (MRI) system according to one embodiment of the present invention.

Referring to FIG. 1, the major components of a magnetic resonance imaging (MRI) system 10 incorporating the present invention are shown. This system is merely exemplary and one skilled in the art will readily understand that variations are not only possible, but frequently occur between various embodiments. For example, while some components are shown as a separate component, it may very well be incorporated into another component.

As shown in FIG. 1, the operation of MRI system 10 is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 can include a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan. The pulse generator module 38 may also be located directly in the scan room.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 or may by sensed by a separate receiver coil system comprising an array of multiple receive coils that are embedded into a structure that is worn by the patient (i.e., a surface coil). The amplified MR signals are demodulated, filtered, and digitized in the receiver section of the transceiver 58. The transmit/receive switch 62 is controlled by a signal from the pulse generator module 38 to electrically connect the RF amplifier 60 to the RF coils 56 during the transmit mode and to connect the preamplifier 64 to the coil 56 during the receive mode. The transmit/receive switch 62 can also enable a separate RF surface coils (not shown) to be used in either the transmit or receive mode.

Figure 2:
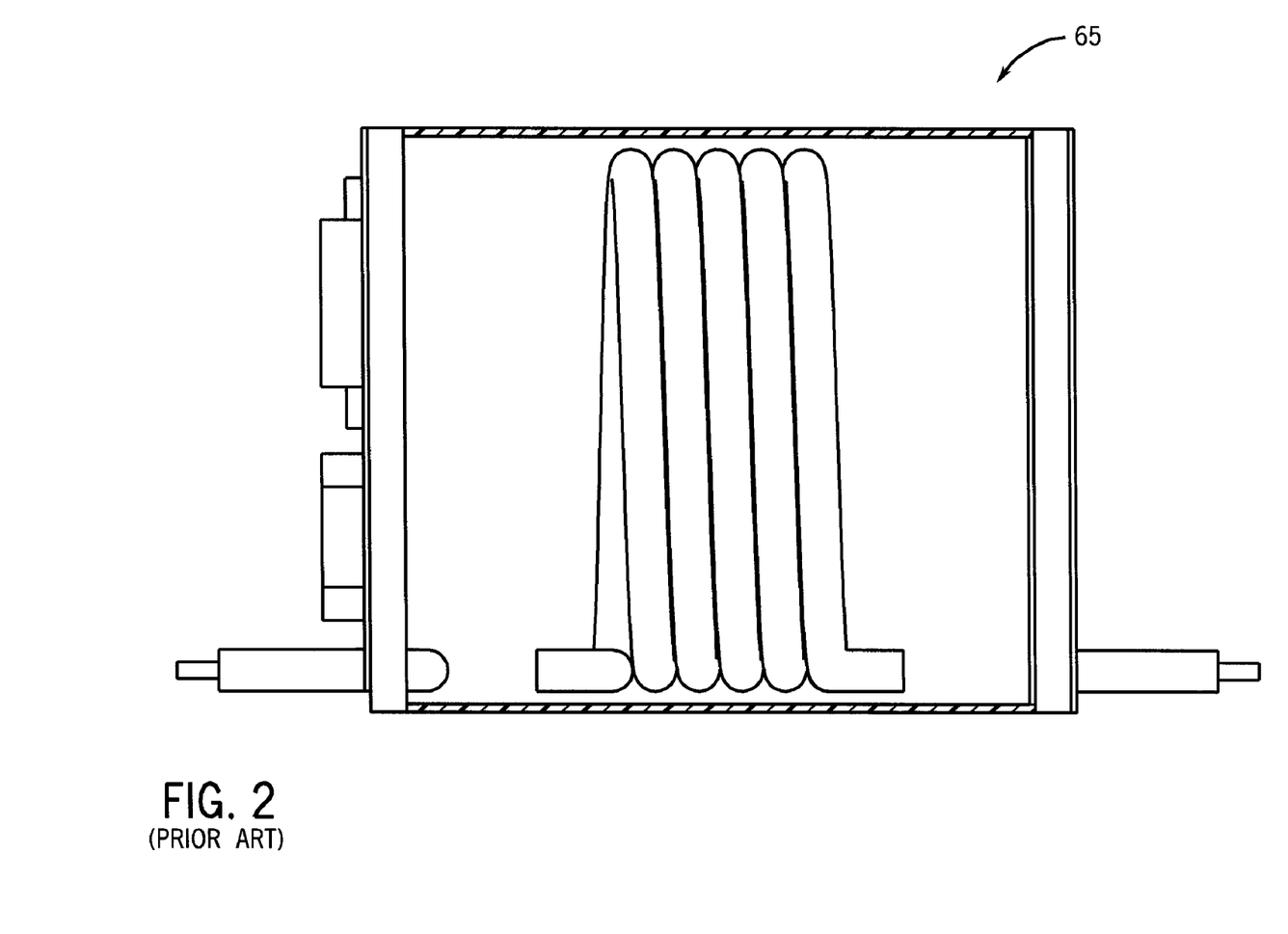
FIG. 2 is a cross-sectional side view of a balun as known in the prior art

One circuit component in conveying the electrical signal from the RF coils 56 to the analog conversion portion of the receiver is the balun. Shown in FIG. 2 is a balun 65 as is commonly known in the prior art. As shown, balun 65 is constructed as a stand-alone component. Such a design can be problematic in that baluns use large circuit components, that when located in, on, or near the RF coils, can interfere with the magnetic flux field and thus reduce the quality and quantity of signals captured by the RF coils. Additionally, when the balun 65 is a stand-alone component, additional space is required to house a separate preamplifier.

Figure 3:
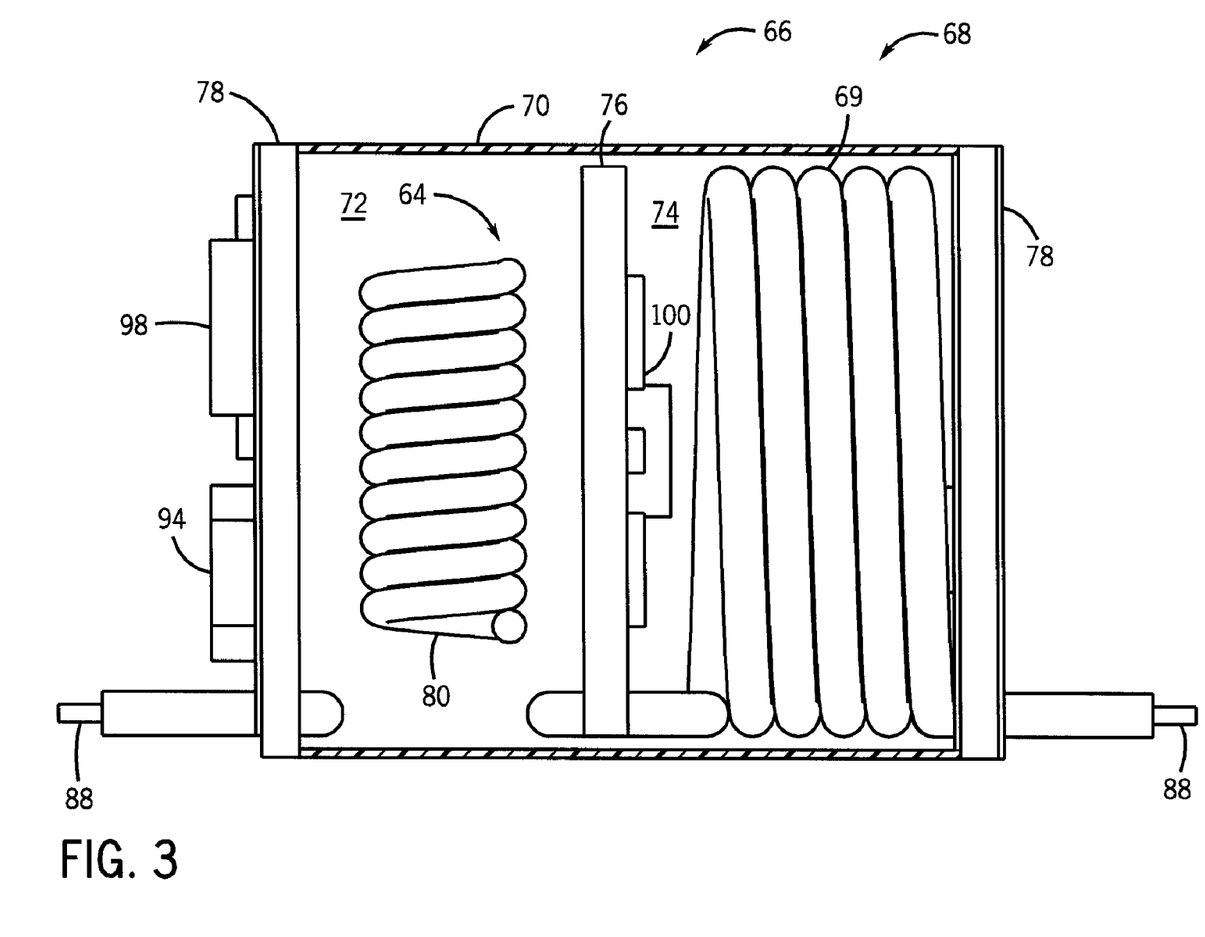
FIG. 3 is a cross-sectional side view of an integrated balun-LNA system according to the present invention.

To maintain the quality and quantity of signals captured by the RF coils 56 of FIG. 1 or the surface coils in a receive mode (generally referred to as receiver coils 56 hereinafter), receiver electronics that are connected to the receiver coils 56 are preferably minimized in volume to reduce interference with the magnetic flux field. That is, as shown in FIG. 3, preamplifier 64 is integrated within balun 66 to form an integrated balun-preamplifier system 68 or module. Preamplifier 64, as identified in FIG. 3, includes the input matching inductor 80 as well as amplifier circuitry that is shown in greater detail in FIG. 5. Similarly, balun 66 includes the components of common-mode inductor 69, balun shield 70, and capacitor 94. In a preferred embodiment, the preamplifier 64 is configured as a low noise amplifier (LNA) 64 that operates to amplify the weak electromagnetic signals received by the receiver coils 56 (shown in FIG. 1), by connecting the LNA 64 directly into the received signal. The integrated balun-LNA system/module 68 reduces the volumetric impact of the LNA 64 and balun 66 on the magnetic flux of signals received by the receiver coils, by reducing the overall volume of the two components as compared to when each of the balun 66 and the LNA 64 are separately housed and electrically connected to the receiver coils. To achieve this volume reduction, the integrated balun-LNA system 68 is enclosed within a typical balun 66 (i.e., enclosed within balun housing 70), with the LNA 64 partly located in a first chamber 72 thereof and the common-mode inductor 69 and remainder of the LNA 64 located in a second chamber 74 thereof. Separating the first chamber 72 from the second chamber 74 is an internal shield 76 configured to block feedback induced signals between the first chamber and the second chamber and the circuit therein.

The balun shield 70 is constructed to enclose integrated balun-preamplifier system 68. Balun shield 70 is constructed of an electrically conductive rigid tube that includes an end cover/plate 78 on each end thereof. The electrically conductive rigid tube preferably is comprised of a plexiglass tubing surrounded by a copper sleeve, although it is envisioned that other similarly suited materials can also be used. Each of the end covers 78 joins with the electrically conductive rigid tube of balun shield 70 to form an external shield that further blocks feedback induced signals and externally generated signals. The end covers 78 also include a miniature electronics package (not shown) thereon that includes printed circuit boards, electronic components, and passive devices, as will be explained in greater detail below.

Figure 4:
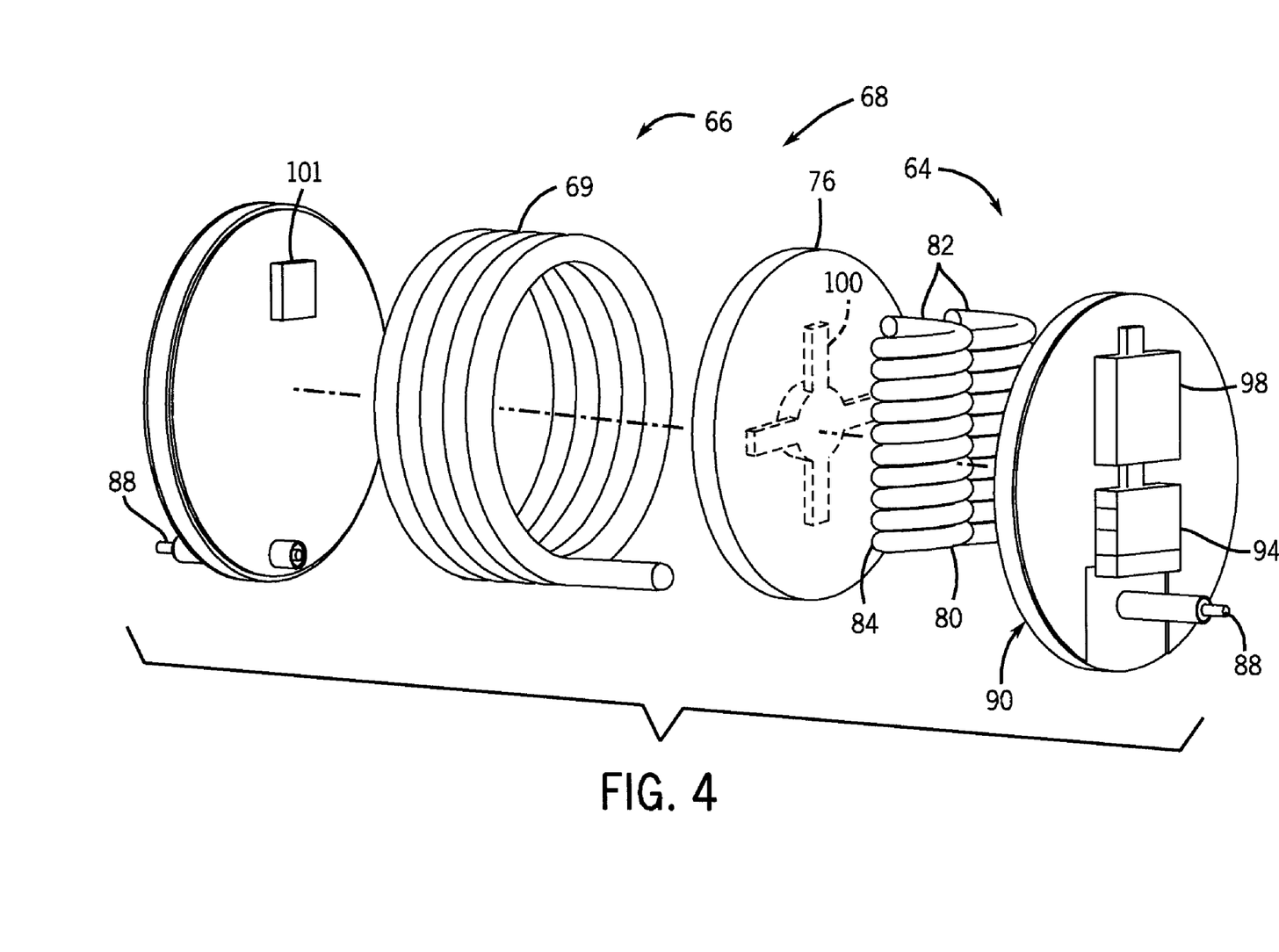
FIG. 4 is an exploded perspective view of the integrated balun-LNA system of FIG. 3.
Figure 5:
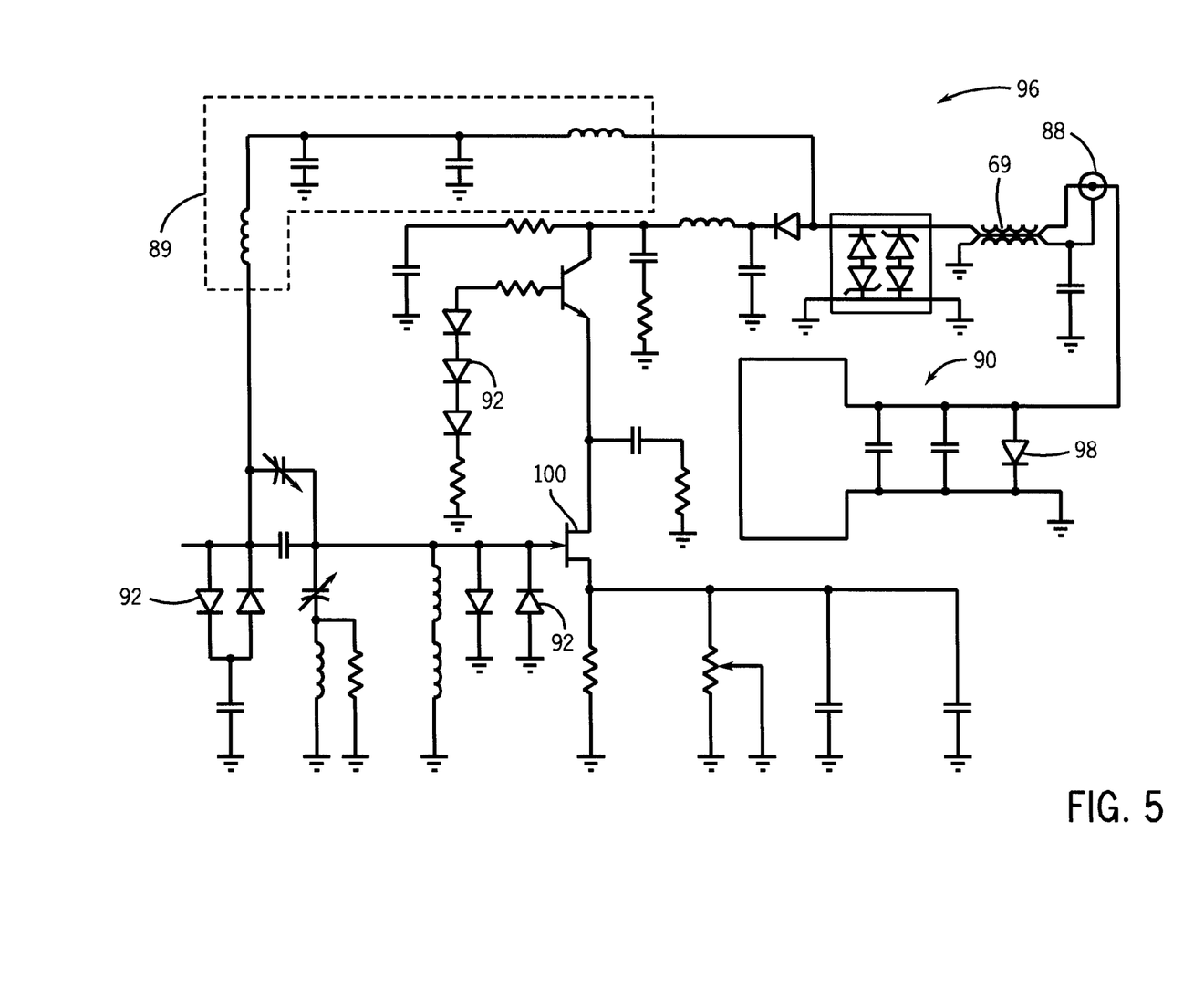
FIG. 5 is a schematic circuit diagram of the integrated balun-LNA system of FIG. 3.

LNA, generally referred to as 64 in FIG. 4, includes input matching inductor 80 and LNA circuitry, which is shown in greater detail in FIG. 5. Referring back to FIG. 4, one component of LNA 64 is field effect transistor (FET) 100, which is preferably mounted to internal shield 76 and located in second chamber 74. Input matching inductor 80 is made up of two separate inductor coils 82, 84. Inductor coils 82, 84 are arranged such that the magnetic flux of inductors 82, 84 is well contained inside the volume of the coils. This configuration ensures minimal variation of the inductance when enclosed by balun shield 70. Input matching inductor 80 provides input matching between the receiver coil 56 of FIG. 1 and an amplifier chip (e.g., PHEMT), and works in conjunction with a capacitor.

Connected to the LNA 64 is common-mode inductor 69 of balun 66, which functions as a passive device in the integrated balun-LNA system 68. As shown in FIG. 4, common-mode inductor 69 is preferably in the form of a common mode choke coil made by winding a co-axial cable in the form of a cylindrical spiral, the co-axial cable having a non-magnetic core. The common-mode inductor 69 is configured to have a high reactance to the imaging frequency when common-mode currents flow through it and a low reactance to the imaging frequency when differential-mode currents flow through it, and thus, together with the common-mode capacitor 94, forms a parallel resonant circuit that exhibits a high impedance to common-mode currents at the imaging frequency, thereby effectively decoupling the receiver coils 56 of FIG. 1 from the MRI system 10 by preventing electromagnetic interference in the analog conversion portion of the transceiver 58, also shown in FIG. 1. Also in a preferred embodiment, the common-mode inductor 69 (i.e., common mode choke coil) is oriented 90 degrees to the input matching inductor coils 82, 84 of the LNA 64. Such a construction minimizes mutual magnetic coupling between the coils.

Referring still to FIG. 4, the co-axial cable that forms common-mode conductor 69 also forms, in part, signal line 88, along with additional co-axial cable added thereto. In one embodiment, the signal line 88 is configured as a triple-function signal line 88 that transmits electromagnetic signals into the balun-LNA system 68, powers the LNA 64 in one mode, and also provides a bias for a transmit protection circuit 90 (shown in FIG. 5) in another mode. Signal line 88 can be composed of any material suitable for transmitting both power and communication signals, although in a preferred embodiment, it is a co-axial cable comprised of a non-magnetic conductive material.

The functions of the signal line 88 are separated by way of one or more diodes contained in the circuit 96 of the integrated balun-LNA system as shown in FIG. 5. Referring to FIG. 5, an exemplary circuit 96 is diagrammed for the integrated balun-LNA system of the present invention. As shown therein, diodes 92 are used to separate the power functions of the signal line 88 and control power transmission to the LNA. That is, diodes 92 connect the LNA to signal line 88 to power LNA by way of a positive DC voltage and disconnect LNA by way of a negative DC current. Additionally, diodes 92 provide a bias to transmit power to transmit protection circuit 90 by way of transmit protection bias circuit 89.

The circuit 96 in the integrated balun-LNA system shown in FIG. 5 is preferably a single 3D component that combines the individual circuits of the separate balun, preamplifier, and transmit protection bias circuit 89. The integrated circuit 96 is mounted to or integrated with end covers 78 and internal shield 76 of the balun shield 70, shown in FIG. 3, and is minimized by way of flexible printed circuits (patterned metal on polymide), organic substrates (thin laminate PCBs), electronic components or devices (thin, bare, or packaged ICs), and/or passive devices (resistors, capacitors, inductors formed within or attached to the PCBs, etc.). The integrated circuit 96 is designed to allow for powering of the LNA and transmit protection circuit 90 through the signal line 88, thus eliminating the need for additional power sources or lines.

As shown in FIG. 5, transmit protection circuit 90 is located apart from the circuit 96 of the integrated balun-LNA system and is connected by signal line 88. In this embodiment, the transmit protection circuit 90 is located adjacent to the receiver coil 56 shown in FIG. 1. Alternatively, it is also envisioned that transmit protection circuit by incorporated into circuit 96 and into the overall design of the integrated balun-LNA system 68 shown in FIG. 3. As shown in FIG. 5, transmit protection circuit 90 also contains one or more PIN diodes 98. PIN diode 98 is configured to transmit a negative DC current from signal line 88 to the transmit protection circuit 90 and reduce power consumption therein. Rather then implementing a PIN diode 98, it is also envisioned that the transmit protection circuit 90 could implement a MEMS switch, MOSFET, or other MEMS protection device or semiconductor switch that reduces power consumption and transmits a voltage to the transmit protection circuit 90.

In another embodiment, it is also envisioned that an energy storage device be included in the circuit 96 of the integrated balun-LNA system. In one embodiment, a capacitor can be used to temporarily store energy. The capacitor functions to maintain performance of the integrated balun-LNA system by reducing interference that can be caused during switching in the signal line, as can occur during powering of the LNA and the transmit protection circuit. For example, the capacitor provides a temporary source of power to the LNA to maintain operation thereof during the transmit protection phase of the signal line operation. As an additional element, filters can be employed to further help mask this switching between the LNA and the transmit protection circuit. While a capacitor has been described for reducing interference during switching of the signal line powering, it is also envisioned that other suitable devices can be employed for the same purpose.

Referring back to FIG. 3, other additional components can also be added to the integrated balun-LNA system 68. In one embodiment of the present invention, a Schottky diode 101 is included to disconnect the LNA 64 from signal line 88 during a transmit phase.

Figure 6:
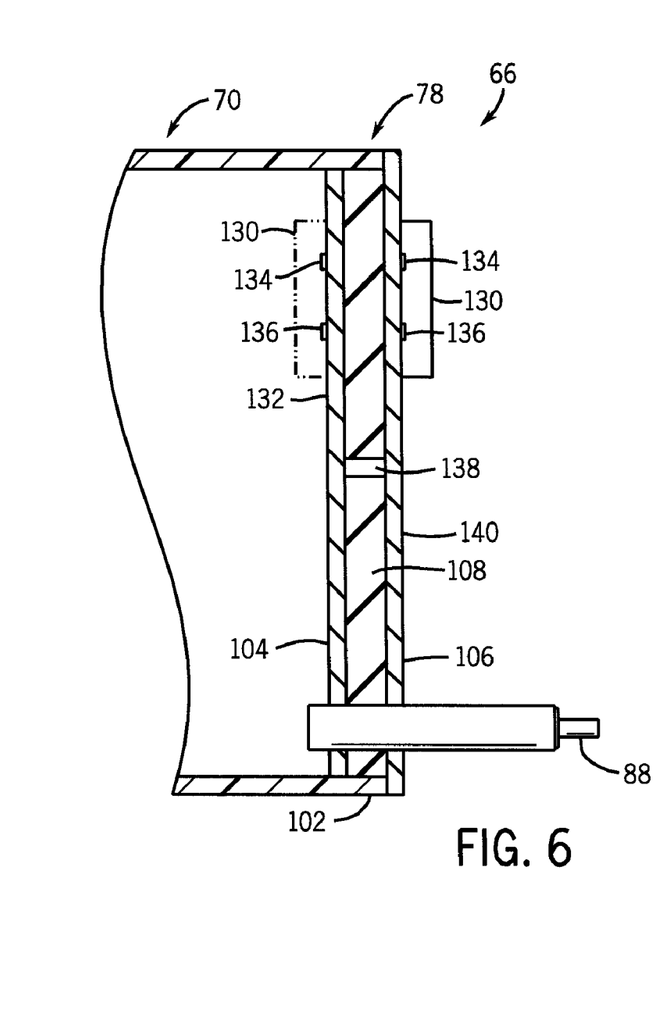
FIG. 6 is a detailed cross-sectional side view of a balun shield according to one embodiment of the present invention.

Beyond any modifications implemented in the circuitry of the integrated balun-LNA system 68, modifications can also be made to the balun shield 70. To further enhance the performance of the balun shield 70, it is envisioned that a capacitive element can be integrated into the balun shield 70 design. As shown in FIG. 6, end cover 78 of the balun shield 70 is constructed as a two conductor parallel plate capacitor 102 that, together with balun shield 70, forms a parallel resonant circuit. Parallel plate capacitor 102 includes an inner conductor plate 104 and an outer conductor plate 106 comprised of a non-magnetic conductive material. As one example, conductors 104, 106 comprise aluminum conductors. Between the inner and the outer conductor plates 104, 106 is a dielectric substrate 108 that maintains an electric field between the conductor plates 104, 106. In one embodiment, the dielectric substrate 108 is comprised of Kapton, FR4, or a BaTi (barium titanium) based ceramic. It is envisioned, however, that other materials may form the dielectric substrate 108. Inner and outer conductor plates 104, 106 adhere to dielectric substrate 108 via, for example, an adhesive or through bonding by means such as sputtering of the conductors onto the substrate or by thermal bonding.

An additional capacitor unit 130 can be attached to the parallel plate capacitor 102 to increase or tune capacitance in the balun shield 70. In one embodiment, the capacitor unit 130 is mounted to the inward facing surface 132 of inner conductor plate 104. A first terminal 134 of the capacitor unit 130 is attached to the inner conductor plate 104. A second terminal 136 of the capacitor unit 130 is connected to the outer conductor plate by way of vias 138 in the parallel plate capacitor 102. Alternatively, the capacitor unit 130 can be mounted to the outward facing surface 140 of the outer conductor plate 106. In this configuration, first terminal 134 of the capacitor unit 130 is connected to the outer plate capacitor 106 and second terminal 136 is connected to the inner conductor plate 104 by vias 138 through the outer conductor plate 106.

Figure 7:
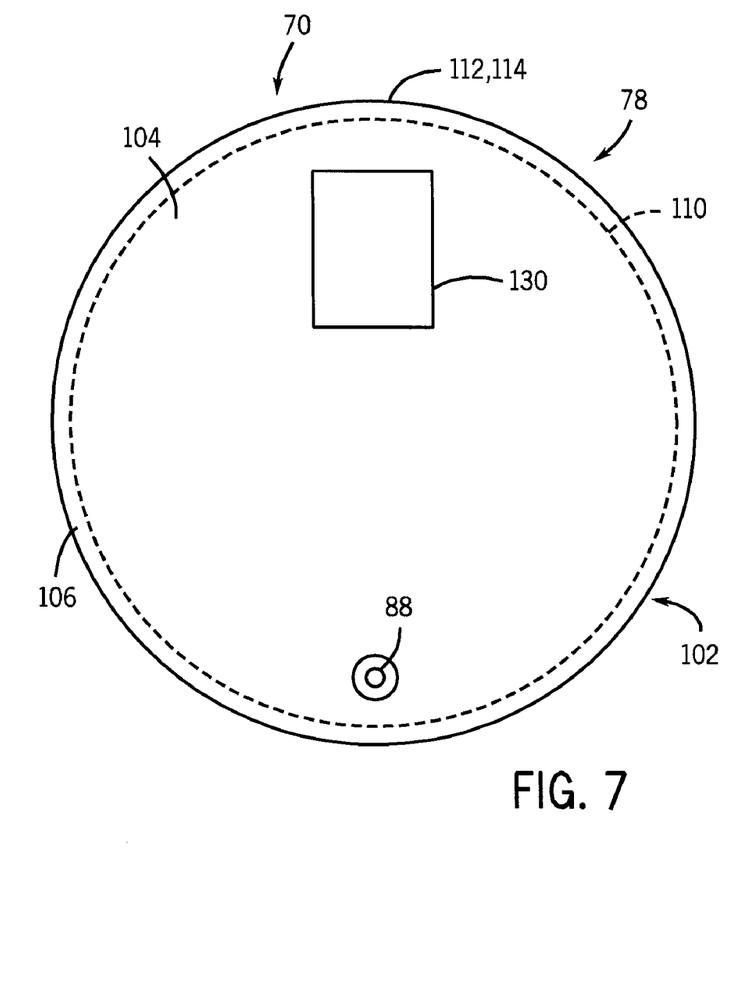
FIG. 7 is an end plan view of the balun shield of FIG. 6.
Figure 8:
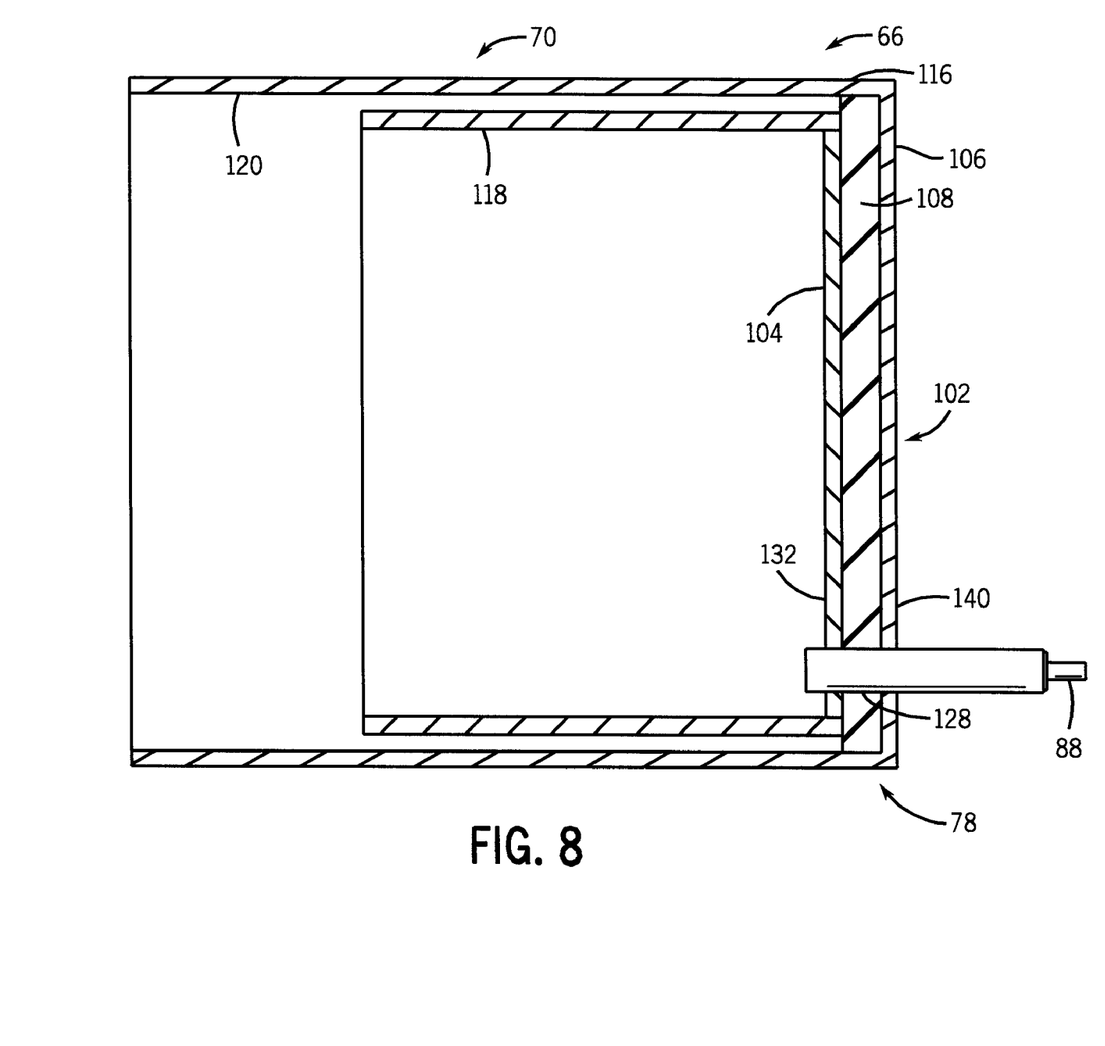
FIG. 8 is a side cross-sectional view of an additional embodiment of the balun shield of FIG. 6.

FIG. 7 shows the inner conductor plate 104 and the outer conductor plate 106 configured to substantially overlap each other to ensure proper shielding to the electrical devices and circuitry contained in the balun shield 70. The overlapping inner and outer conductor plates 104, 106 of the parallel plate capacitor 102 provide a reduction in the gap between the end cover 78 and the balun shield 70 that is typically present when a physical resonant capacitor is attached to the end cover 78 of a balun shield 70. In one embodiment, the inner conductor plate 104 is configured to be fitted inside the cylindrical balun shield 70. As such, the circumference 110 of the inner conductor plate 104 is sized to be smaller than the circumference 112 of the balun shield 70. The circumference 114 of outer conductor plate 106 is constructed to overlap the circumference 112 of the balun shield 70. In another embodiment, as shown in FIG. 8, outer conductor plate 106 can further include an outer lip 116 that extends axially inward over a small portion of the balun shield 70 to form a cup-like structure that encircles the balun shield 70. Such a construction allows the circumference 114 of outer conductor plate 106 to be seam soldered to the circumference 112 of the balun shield 70 to create a solid connection between the end cover 78 and the balun shield 70 and ensure quality shielding.

As also shown in FIG. 8, the inner conductor plate 104 is further configured to extend axially inward from the end cover 78. The inner conductor plate 104 includes an inward extending portion 118 that runs along the circumference thereof to form a cup-shaped inner conductor plate 104. The inner conductor plate 104 fits within the cylindrical balun shield 70 and extends along an inner surface 120 thereof. Such a cup-shaped inner conductor plate 104 allows for additional capacitance to be added into the overall design of the balun shield 70.

Additional methods and mechanisms are also envisioned to program and adjust desired capacitance into the balun shield 70. In one embodiment, the radius and overall surface area of the inner conductor plate 104 can be reduced to effect capacitance in the parallel plate capacitor 102. In an additional embodiment, capacitance of the parallel plate capacitor 102 can be programmed by selective patterning and pattern interconnection on the end cover 78 to obtain a desired capacitance amount. Additional surface mount components can also be mounted to the inner conductor plate 104 to affect capacitance. In yet another embodiment, capacitance can be programmed by changing the thickness of the dielectric substrate 108 between the inner conductor plate 104 and the outer conductor plate 106.

Also in one embodiment, parallel plate capacitor 102 is constructed to allow for passage of signal line 88 therethrough. Preferably, the signal line 88 can be guided through the parallel plate capacitor 102 through a passage 128 positioned near the outer circumference of the parallel plate capacitor 102, as shown in FIG. 8. Alternatively, it is envisioned that signal line 88 can be guided through a passage positioned in the center of the parallel plate capacitor 102.

Figure 9:
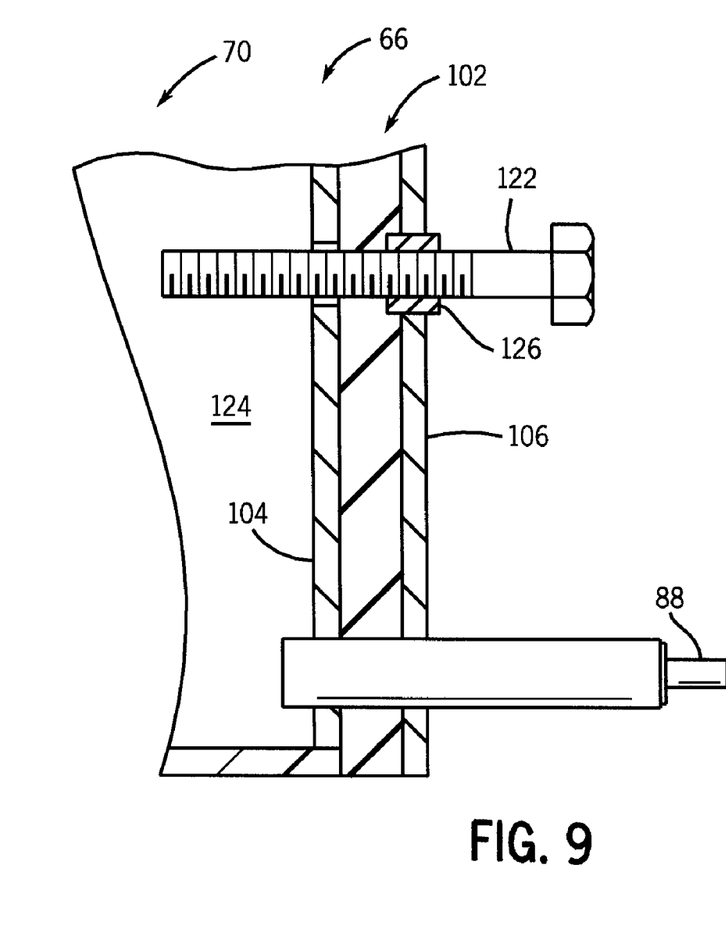
FIG. 9 is a side cross-sectional view of an additional embodiment of the balun shield of FIG. 6.
Figure 10:
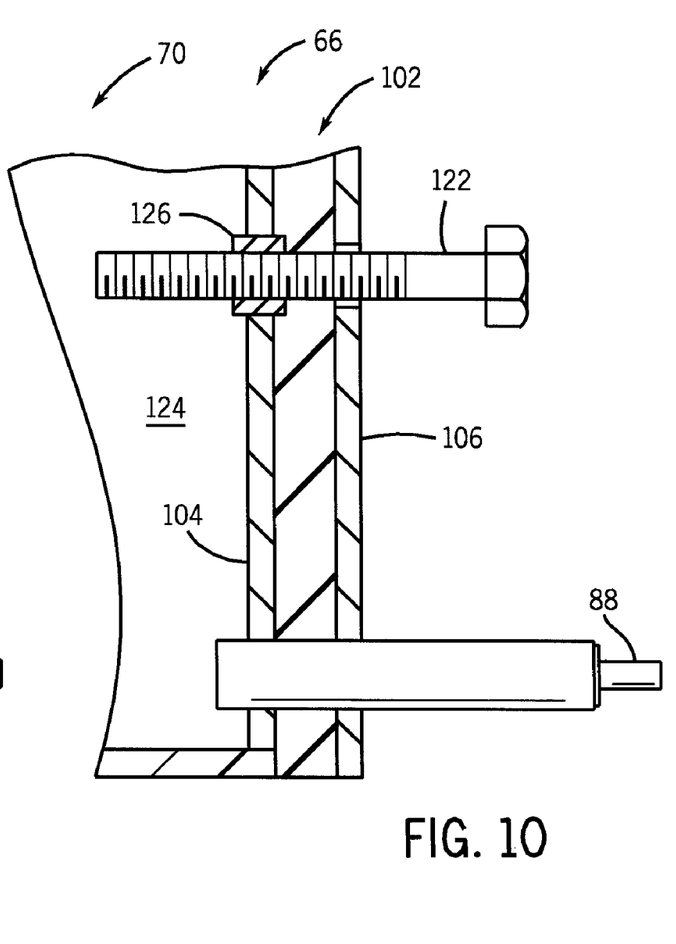
FIG. 10 is a side cross-sectional view of an additional embodiment of the balun shield of FIG. 6.

FIG. 9 shows an additional embodiment of the balun shield 70 design where a non-magnetic conductive screw 122 is included in the balun shield 70. Non-magnetic conductive screw 122 is inserted axially through the parallel plate capacitor 102 and is configured to allow frequency tuning in the balun 66. That is, an operator can adjust the depth of penetration of the non-magnetic conductive screw 122 through the parallel plate capacitor 102 and into the interior cavity 124 of the balun 66 to adjust the inductance of the common-mode inductor 69 (shown in FIG. 4) and enhance the frequency of the balun 66. By tuning the frequency of the parallel resonant circuit created by the parallel plate capacitor 102 and common-mode inductance to match the imaging frequency, common mode currents of the imaging frequency can be significantly reduced from propagating down the signal line 88 and degrading the desired electromagnetic signal. As shown in FIG. 9, in one embodiment, the non-magnetic conductive screw 122 is electrically connected to the outer conductor plate 106 and electrically isolated from the inner conductor plate 104, so as to prevent shorting there between. In an alternate embodiment shown in FIG. 10, the non-magnetic conductive screw 122 is electrically connected to the inner conductor plate 104 and electrically isolated from the outer conductor plate 106. The electrical connection of the non-magnetic conductive screw 122 to either the inner or outer conductor plate 104, 106 allows the balun to resist electromagnetic field generated disturbances.

To provide mechanical support to the non-magnetic conductive screw 122, a threaded non-magnetic flange 126 can be included in the parallel plate capacitor 102. As shown in FIG. 9, the flange 126 is attached to the outer conductive plate 106 to support the non-magnetic conductive screw 122 as it passes through the parallel plate capacitor 102. While the construction of the flange 126 and its exact dimensions can vary, it is envisioned that the flange 126 is able to sufficiently support the non-magnetic conductive screw 122.

Referring back to FIG. 6, parallel plate capacitor 102 integrated into end cover 78 is envisioned as being included in balun shield 70 of a standard, stand-alone balun. However, parallel plate capacitor is also envisioned as being included in the end cover of the integrated balun-LNA system 68 described in detail above and shown in FIGS. 3 and 4. Regardless of the exact system it is incorporated with, the integration of the parallel plate capacitor 102 into the balun shield 70 helps to reduce the number of components in the balun and reduce manufacturing steps.

Therefore, in accordance with one embodiment of the present invention, a magnetic resonance imaging (MRI) system includes at least one magnet for generating a magnetic field, at least one gradient coil for manipulating the magnetic field generated by the at least one magnet by way of a gradient field, and at least one receiver coil to receive electromagnetic signals from the manipulated magnetic field. Also included in the MRI system is at least one balun connected to the receiver coil to condition the received electromagnetic signals, the at least one balun including a balun shield having a capacitance and a common-mode inductance to create a parallel resonant circuit.

In accordance with another embodiment of the present invention, a balun module includes a common-mode inductor and a shield having an end plate thereon. The balun module further includes a two conductor parallel plate capacitor integrated into the end plate.

In accordance with yet another embodiment of the present invention, a method of manufacturing a balun module includes enclosing a common-mode inductor within a balun shield and attaching an end plate to the balun shield. The method further includes integrating a parallel plate capacitor into the balun shield, wherein the parallel plate capacitor has a non-magnetic inner conductor and outer conductor on a dielectric substrate.

The present invention has been described in terms of the preferred embodiment, and it is recognized that equivalents, alternatives, and modifications, aside from those expressly stated, are possible and within the scope of the appending claims.

What is claimed is:

1. A magnetic resonance imaging (MRI) system comprising: at least one magnet configured to generate a magnetic field;
at least one gradient coil manipulating the magnetic field generated by the at least one magnet by way of a gradient field;
at least one receiver coil, receiving electromagnetic signals from the manipulated magnetic field;
at least one balun connected to the receiver coil in order to condition the received electromagnetic signals; and
wherein the at least one balun includes a balun shield having a capacitance and a common mode inductance that creates a parallel resonant circuit.

2. The MRI system of claim 1 wherein the balun shield is comprised of a two conductor parallel plate capacitor forming an end cover on each end of the balun, the two conductor parallel plate capacitor further comprising:
an inner conductor plate;
an outer conductor plate; and
wherein a portion of the outer conductor plate and the inner conductor plate overlap.

3. The MRI system of claim 2 further comprising:
a co-axial cable transmitting the received electromagnetic signals into the at least one balun, the co-axial cable positioned so that the exit of the balun shield is at one of:
a center of the end cover and
near a circumferential edge of the end cover.

4. The MRI system of claim 2 wherein the inner conductor plate extends axially inwards along an inner surface of the balun shield order to add additional capacitance to the balun shield.

5. The MRI system of claim 2 wherein a circumference of the inner conductor plate is smaller than a circumference of the balun shield and wherein a circumference of the outer conductor plate is configured in order to connect to the circumference of the balun shield.

6. The MRI system of claim 2 wherein the two conductor parallel plate capacitor is comprised of a non-magnetic conductive material on a dielectric substrate.

7. The MRI system of claim 6 wherein the dielectric substrate is one of Kapton, a BaTi based ceramic, and FR4.

8. The MRI system of claim 1 further comprising an inductor that, together with the balun shield, forms the parallel resonant circuit.

9. The MRI system of claim 8 wherein the parallel resonant circuit is tuned to an imaging frequency and reduces common mode currents of the imaging frequency.

10. The MRI system of claim 9 further comprising a non-magnetic conductive screw inserted axially through the two conductor parallel plate capacitor in order to tune the parallel resonant circuit to the imaging frequency.

11. The MRI system of claim 10 wherein the non-magnetic conductive screw is electrically connected to the inner conductor plate and electrically isolated from the outer conductor plate.

12. The MRI system of claim 10 wherein the non-magnetic conductive screw is electrically connected to the outer conductor plate and electrically isolated from the inner conductor plate.

13. The MRI system of claim 10 further comprising:
a threaded non-magnetic flange attached to the outer conductor plate and configured to support the non-magnetic conductive screw.

14. The MRI system of claim 2 further comprising a capacitor unit mounted to the two conductor parallel plate capacitor in order to provide additional capacitance into the balun shield, wherein the capacitor unit is electrically connected to the two conductor parallel plate capacitor by way of vias therein.

15. A balun module compatible with a magnetic resonance imaging system comprising:
a common mode inductor disposed adjacent to a shield having an end plate thereon; and
a two conductor parallel plate capacitor integrated into the end plate.

16. The balun module of claim 15 wherein the two conductor parallel plate capacitor further comprises:
an inner conductor plate;
an outer conductor plate;
a dielectric substrate between the inner and outer conductor plate; and
wherein the inner conductor plate and outer conductor plate are comprised of a non-magnetic conductor.

17. The balun module of claim 16 wherein the inner conductor plate further comprises a cylindrical conductor extending axially inwards along an inner surface of the shield in order to increase capacitance of the balun module.

18. The balun module of claim 16 wherein a circumference of the inner conductor plate is smaller than a circumference of the shield and wherein a circumference of the outer conductor plate joins to the circumference of the shield in order to enhance shielding within the shield.

19. The balun module of claim 16 further comprising: an additional capacitor in order to increase capacitance in the shield, the additional capacitor being electrically connected to the parallel plate capacitor by way of vias therein.

20. The balun module of claim 15 further comprising a tuning screw inserted into the parallel plate capacitor of the shield along an axial axis thereof in order to tune inductance of the common-mode inductor.

21. The balun module of claim 20 further comprising: a threaded non-magnetic flange attached to the outer conductor plate and configured to support the tuning screw.

22. A method of assembling a balun module which is compatible with MRI, the method comprising:
enclosing a common-mode inductor within a balun shield;
attaching an end plate to the balun shield; and
integrating a parallel plate capacitor into the balun shield, the parallel plate capacitor having a non-magnetic inner conductor and outer conductor on a dielectric substrate.

23. The method of claim 22 further comprising connecting an additional capacitor in order to the balun shield to adjust capacitance therein.

24. The method of claim 22 further comprising inserting a tuning screw into the parallel plate capacitor in order to tune inductance in the common mode inductor.

25. The method of claim 22 further comprising:
forming the inner conductor in order to extend axially inward from the end plate along an inner surface of the balun shield in order to add additional capacitance.

26. The method of claim 22 further comprising adding one of an external tunable capacitor and an external fixed value capacitor into the balun shield.

27. The method of claim 22 further comprising controlling the capacitance of the parallel plate capacitor, wherein the controlling includes at least one of:

adjusting a surface area of the inner conductor;
patterning the parallel plate capacitor;
adding a capacitor unit to the inner conductor; and
adjusting the thickness of the dielectric substrate.

* * * * *

UNITED STATES PATENT AND TRADEMARK OFFICE
CERTIFICATE OF CORRECTION

PATENT NO. : 7,652,476 B2
APPLICATION NO. : 11/609282
DATED : January 26, 2010
INVENTOR(S) : de Rooij et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 480 days.

Signed and Sealed this

Twenty-eighth Day of December, 2010

David J. Kappos
*Director of the United States Patent and Trademark Office*